United States Patent [19]
Singh et al.

[11] Patent Number: 5,843,811
[45] Date of Patent: Dec. 1, 1998

[54] METHOD OF FABRICATING A CRYSTALLINE THIN FILM ON AN AMORPHOUS SUBSTRATE

[75] Inventors: Rajiv K. Singh; Rolf E. Hummel; Soon-Moon Jung, all of Gainesville, Fla.

[73] Assignee: University of Florida, Gainesville, Fla.

[21] Appl. No.: 711,126

[22] Filed: Sep. 9, 1996

Related U.S. Application Data

[60] Provisional application No. 60/015,092 Apr. 10, 1996.
[51] Int. Cl.$^6$ .............................. H01L 21/00; H01L 21/20
[52] U.S. Cl. ................................ 438/166; 438/486; 117/8
[58] Field of Search ............................... 117/8; 438/486, 438/918, 488, 166

[56] References Cited

U.S. PATENT DOCUMENTS

| | | | |
|---|---|---|---|
| 4,358,326 | 11/1982 | Doo | 438/486 |
| 4,379,020 | 4/1983 | Glaeser | 438/486 |
| 4,596,604 | 6/1986 | Akiyama et al. | 438/166 |
| 5,254,481 | 10/1993 | Nishida | 437/4 |
| 5,382,537 | 1/1995 | Noguchi | 438/166 |
| 5,466,641 | 11/1995 | Shimizu et al. | 438/486 |
| 5,484,746 | 1/1996 | Ichikawa et al. | 438/486 |
| 5,531,182 | 7/1996 | Yonehara | 437/109 |
| 5,582,640 | 12/1996 | Okada et al. | 438/166 |

*Primary Examiner*—John Niebling
*Assistant Examiner*—Michael S. Lebentritt
*Attorney, Agent, or Firm*—Thomas C. Saitta

[57] ABSTRACT

A method of forming a crystalline thin film from an amorphous semiconductor thin film such as amorphous silicon, by providing a generally planar nucleation inducing member, such as a crystalline silicon wafer, having a number of micro-scale surface contact points and with a hardness equal to or greater than the hardness of the amorphous semiconductor thin film, contacting under pressure the surface contact points of the nucleation inducing member with the exposed surface of the amorphous thin film to form an assembly, annealing the assembly at between 300 to 700 degrees C. for 1 to 24 hours to crystallize the amorphous thin film, and removing the nucleation inducing member.

14 Claims, 6 Drawing Sheets

PROVIDE AMORPHOUS SEMICONDUCTOR
THIN FILM ON BACKING SUBSTRATE
↓
PROVIDE NUCLEATION
INDUCING MEMBER
↓
CLEAN SURFACES
↓
CONTACT NUCLEATION INDUCING MEMBER
TO AMORPHOUS THIN FILM
AND APPLY PRESSURE
↓
ANNEAL AT ELEVATED TEMPERATURE
↓
REMOVE NUCLEATION INDUCING MEMBER

FIGURE 2
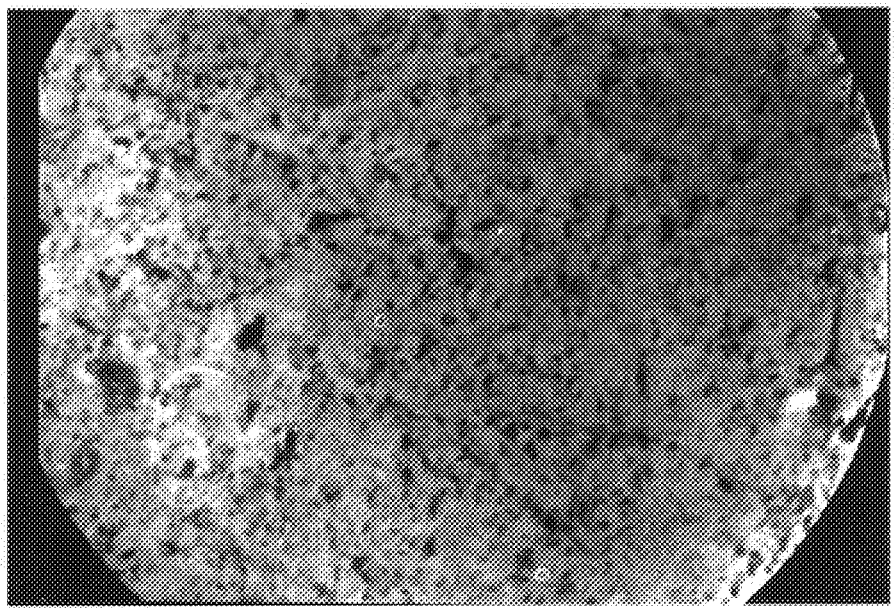
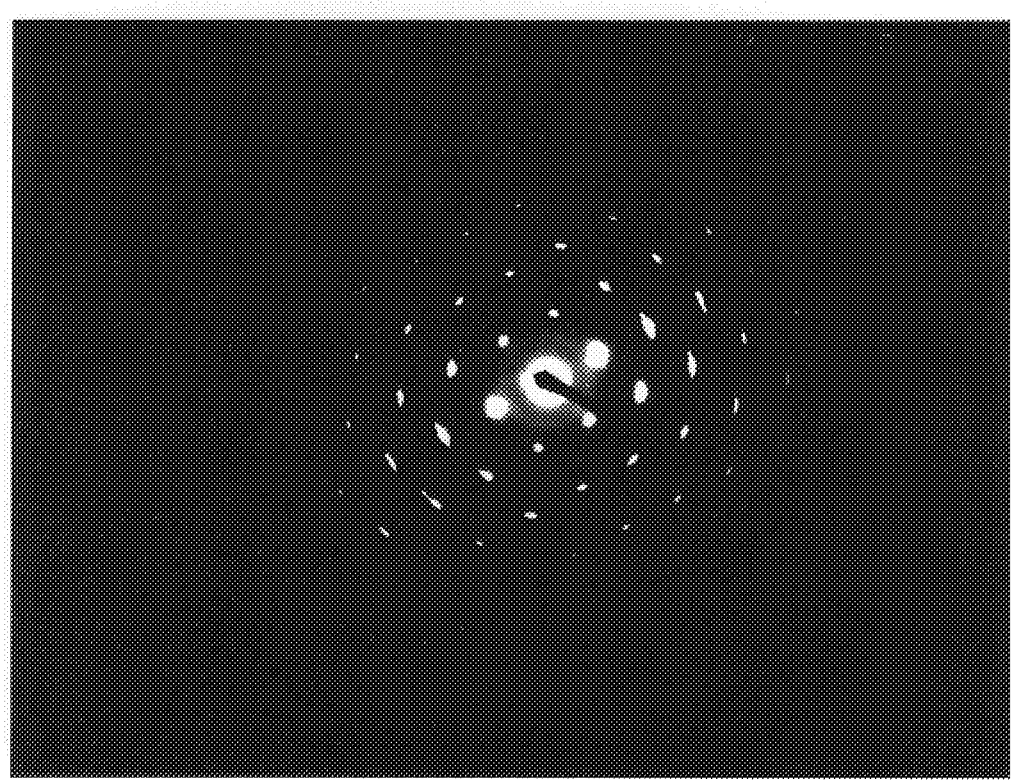
FIGURE 6

FIGURE 3
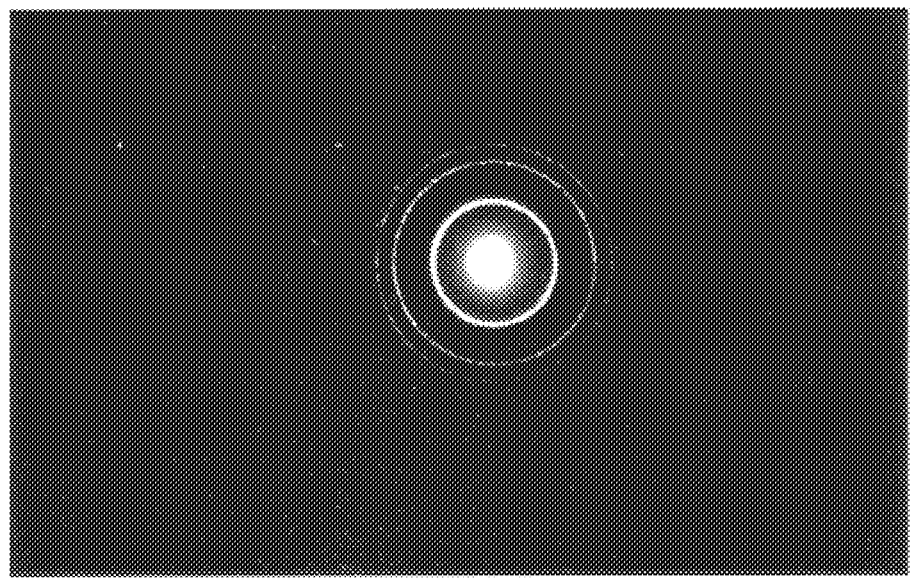
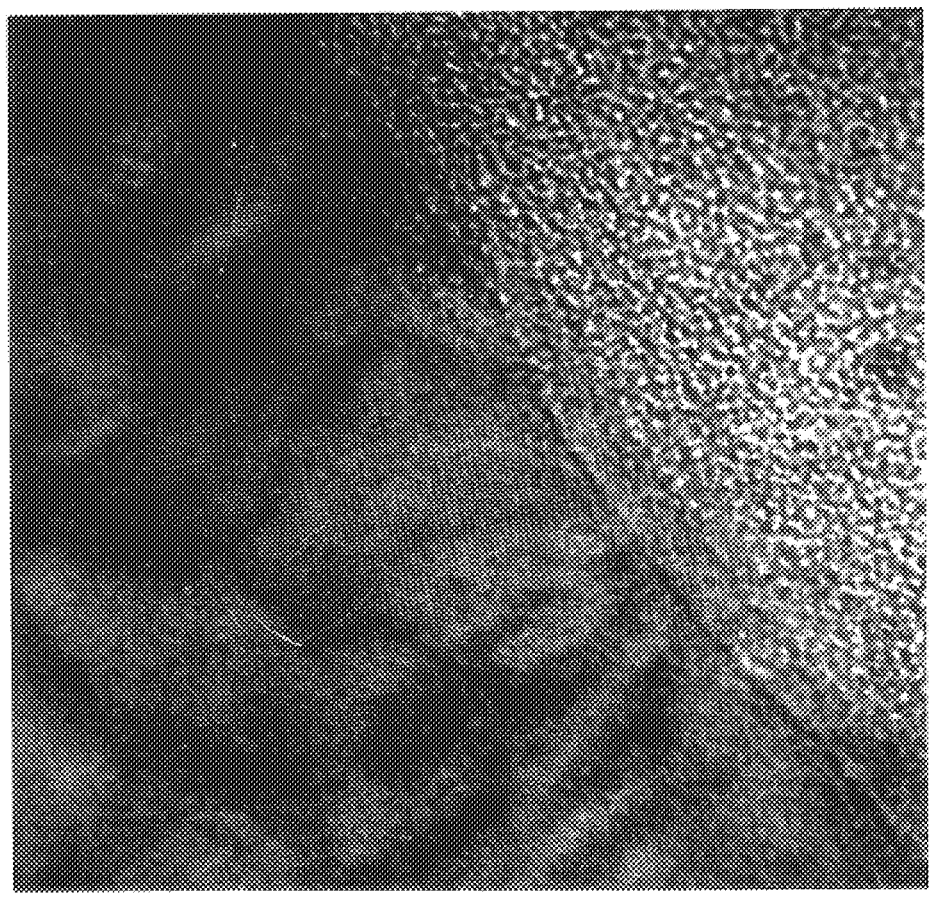
FIGURE 5

METHOD OF FABRICATING A CRYSTALLINE THIN FILM ON AN AMORPHOUS SUBSTRATE

This application claims the benefit of U.S. Provisional Application No. 60/015,092, filed Apr. 10, 1996.

BACKGROUND OF THE INVENTION

This invention relates generally to a method of crystallizing an amorphous, thin film, semiconductor material, such as silicon, germanium or alloys of these materials, and more particularly relates to a method of fabricating a crystalline thin film from an amorphous thin film deposited on a backing substrate. Even more particularly, the invention relates to a method of fabricating such crystalline thin film from the amorphous thin film by pressing a hard, rigid nucleation inducing member, such as a semiconductor wafer, either single crystal, large grained or patterned, against the surface of the amorphous thin film, annealing the assembly at sufficient temperature and time to induce nucleation and growth of the crystalline thin film, and then removing the nucleation inducing member.

A large market exists for liquid crystal flat panel displays (LCD's) for use in computer displays and other applications. In many applications, devices known as thin film transistors are preferred as switching elements for pixels because of their superior optical performance. A thin film transistor incorporates a thin film semiconductor, the properties of which significantly determine the efficiency of the thin film transistor as a whole. Low bulk densities, low intrinsic conductivity, large area uniformity, low temperature growth in processing (so that glass backing substrates can be used) and high growth rates are all important for the thin film semiconductor material. Presently, thin film transistors typically incorporate thin film semiconductors of amorphous silicon (a-Si) or polycrystalline silicon due to their relative low cost and ease of manufacture. Unfortunately, such films are deficient in several key properties, the primary deficiency being in carrier mobility, which limits the performance of thin film transistors. An a-Si film will have a carrier mobility in the range of 1–4 $cm^2$/V-sec and furnace annealed silicon films in the area of about 10 $cm^2$/V-sec. Carrier mobility is adversely affected by grain boundaries and surface roughness, so small grain size is not desirable. Single crystal silicon has a carrier mobility greater than 600 $cm^2$/V-sec, but the cost of large scale production is very high and the method cannot be used for large surface areas. In addition, some applications such as LCD's require devices made on different substrate materials.

It is an object of this invention to provide a method of producing high quality crystalline films from amorphous semiconductor thin films deposited on insulator backing substrates, the crystalline film having relatively large grain size of greater than 10 microns, and relatively good carrier mobility in the range of 100 to 250 $cm^2$/V-sec. It is a further object to produce such a semiconductor film in a relatively low cost and efficient manner, as well as at relatively low temperatures to permit growth of the thin film on a substrate containing glass.

SUMMARY OF THE INVENTION

The invention comprises in general a method for inducing growth of a crystalline thin film on the surface of an amorphous semiconductor thin film deposited on a backing substrate. The semiconductor thin film may comprise silicon, germanium, silicon/germanium alloys or other similar materials. A nucleation inducing member, such as a semiconductor wafer having a roughened surface, is applied against the surface of the semiconductor thin film under force. The assembly is then annealed at between 300 and 700 degrees C., with a preferred range of approximately 525 to 550 degrees C., for a sufficient time to induce crystal nucleation and growth, typically from 1 to 24 hours in the broad temperature range, with an annealing time of approximately 4 to 6 hours in the preferred temperature range providing a suitable crystalline thin film. The thickness of the crystalline film grown from the amorphous semiconductor thin film is determined by the annealing time, increased time resulting in a thicker crystalline film. After cooling, the semiconductor wafer is removed to expose the crystalline thin film. During annealing the heat may be directed at the assembly from the wafer side only, such that nucleation and growth of the crystalline thin film takes place only on the surface of the amorphous semiconductor film.

BRIEF DESCRIPTION OF THE DRAWINGS

FIG. 2 is a TEM photomicrograph of a standard furnace annealed crystalline silicon thin film without induced crystallization.

FIG. 3 is an electron diffraction pattern of the thin film of FIG. 2.

FIG. 5 is a TEM photomicrograph of a crystalline silicon thin film fabricated from an a-Si thin film using the invention methodology.

FIG. 6 is an electron diffraction pattern of the thin film of FIG. 5.

DETAILED DESCRIPTION OF THE INVENTION

Figure 1:
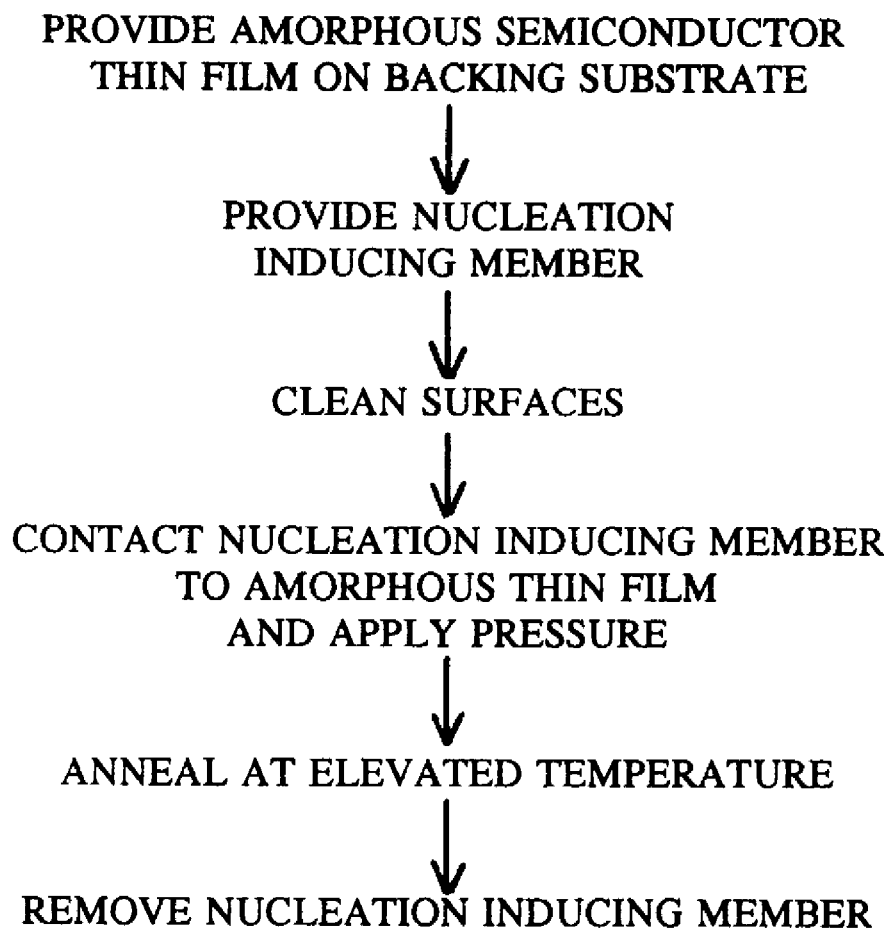
FIG. 1 is a schematic illustrating the processing steps of the invention.

With reference to the figures, the invention will now be described in detail with regard to the best mode and preferred embodiment. The invention is a method for fabricating, under relatively low temperature and time parameters, crystalline thin films from an amorphous thin film deposited on a backing substrate. The methodology is applicable to semiconductor thin films comprised of silicon, germanium, silicon/germanium alloys or similar materials. The methodology will be described herein with reference to an amorphous silicon (a-Si) thin film deposited by conventional methods onto a backing substrate, such as glass, fused silica or other suitable materials, even including crystalline materials, but it is to be understood that the amorphous thin film may be composed of other semiconductor materials. Nucleation and growth of the crystalline thin film on the surface of the amorphous semiconductor thin film is induced by forced contact application of a nucleation inducing member, such as a quartz or silicon wafer, preferably single crystal, onto the exposed surface of the semiconductor thin film, followed by relatively rapid thermal or furnace annealing of the assembly, with the heating applied preferentially to the side of the amorphous semiconductor thin film in contact with the nucleation inducing member. The nucleation inducing member is relatively planar on a macro-scale with a number of micro-scale (for example, less than approximately 20 microns) surface feature contact points created by roughening or patterning the surface using abrasives or micro-machining techniques, and the nucleation inducing member must be equal to or greater in hardness than that of the amorphous semiconductor thin film. A silicon wafer with large grain size, a wafer comprising a crystalline surface thin film, a patterned wafer, a fused silica/quartz wafer, or other materials, amorphous or crystalline, of sufficient hardness may be used as the nucleation inducing member. The preferred material for the nucleation member is the crystalline form of the amorphous film to be crystallized.

The amorphous semiconductor thin film is deposited onto a suitable backing substrate, such as by chemical vapor deposition onto an $SiO_2$ coated piece of quartz, then cleaned to remove impurities from the surface and then dried. A nucleation inducing member, such as a single crystal silicon wafer, is prepared. The single crystal silicon wafer is preferably roughened, then cleaned and dried to remove oxides and impurities, such as by exposure to a buffered hydrofluoric acid solution, as is the exposed amorphous semiconductor film. The single crystal silicon wafer is then placed onto the exposed surface of the amorphous semiconductor thin film and the assembly is then clamped to finger tightness or higher pressure using a screw type mechanism to force the nucleation inducing member into direct contact with the surface of the amorphous semiconductor thin film. The assembly is then placed into a furnace for annealing. The assembly is preferably annealed at between 300 to 700 degrees C., and most preferably between 525 and 550 degrees C. for a period of time sufficient to induce nucleation and growth of a crystalline thin film on the surface of the amorphous semiconductor thin film, typically from 1 to 24 hours, or more depending on the annealing temperature, and in the range of 4 to 6 hours for the most preferred temperature range. The thickness of the crystalline thin film formed on the surface of the amorphous semiconductor film is dependent on time and temperature, with increased time or temperature resulting in thicker films. It is preferred that the annealing temperature be maintained relatively low such that crystallization will occur only on the surface of the amorphous semiconductor film. After cooling, the assembly is separated to expose the crystalline silicon thin film now present on the surface of the amorphous semiconductor thin film. Alternatively, the amorphous semiconductor film may be annealed by rapid thermal treatment, such as by unidirectional exposure from a bank of high temperature lamps directed at the surface of the a-Si film in contact with the nucleation inducing member. In another alternative method, the nucleation inducing member may be removed during the annealing step has initiated nucleation to expose the semiconductor thin film to the elevated temperature to accelerate crystal formation.

Figure 8:
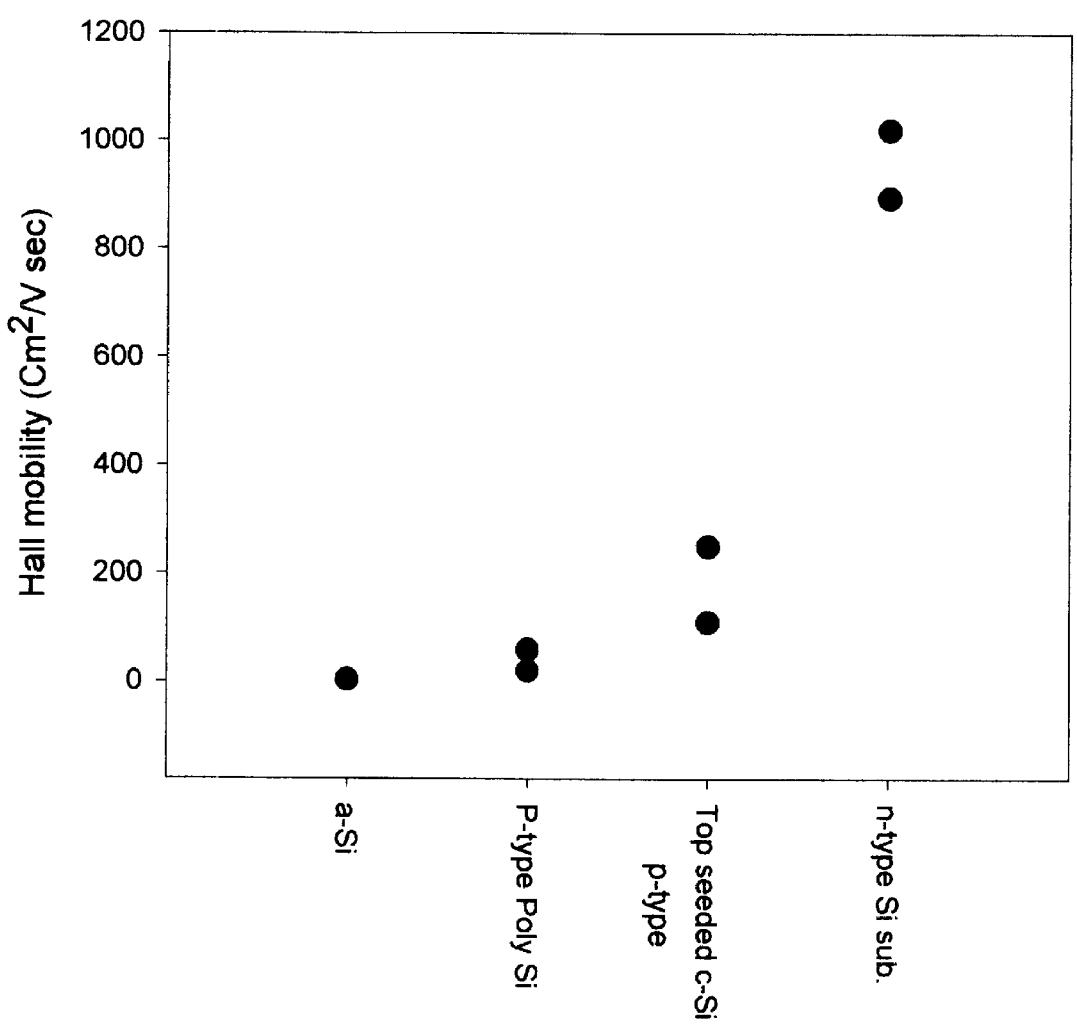
FIG. 8 is a graph comparing carrier mobilities of different silicon thin films.

The crystalline thin film so produced exhibits improved properties over the thin films now commonly in use for thin film transistors. The carrier mobility for the polycrystalline thin film produce by the method of the invention is in the range of 25 to 600 $cm^2$/V-sec, as compared to a carrier mobility of less than approximately 10 $cm^2$/V-sec for amorphous films and annealed p-type silicon films, as shown in FIG. 8. The crystalline thin film also exhibits a (110) orientation regardless of the orientation of the nucleation inducing member.

As an example of the methodology, a three layer assembly of an amorphous thin film of a-Si, an amorphous middle layer of 6000 Å $SiO_2$ and a bulk backing substrate of (100) Si was prepared. The silicon oxide layers were grown thermally on top of the Si substrate up to 5000 Å, then an additional layer of 1000 Å $SiO^2$ was deposited by low pressure chemical vapor deposition (LPCVD), and finally the top amorphous layer was deposited by vertical type LPCVD at 540 degrees C. to create a completely amorphous phase. The surface was cleaned in a deionized water rinse for 30 seconds, soaked in $H_2SO_4$ for 1 minute, rinsed again with deionized water, oxide etched with 6:1 buffered oxide etchant for 1 minute, rinsed again with deionized water and blown dry with tetrafluoroethane gas.

The nucleation inducing member was prepared by roughening the contact surface of a silicon wafer with 1 to 5 micron particle size $Al_2O_3$ polishing powder to produce a contact surface, then the silicon wafer was annealed at 1200 degrees C. for 2 hours to recover damages from grinding. The silicon wafer was then cleaned in the same manner as the a-Si substrate, and the contact surface of the silicon wafer was placed onto the prepared surface of the a-Si substrate within 1 minute of finishing the cleaning steps to minimize oxide development. A mechanical clamp was then applied to the silicon wafer/a-Si assembly and finger tightened to press the contacting surfaces together. The assembly was then placed into a furnace for annealing in nitrogen gas atmosphere and heated to between 525 and 675 degrees C., with heat directed toward the a-Si surface in contact with the silicon wafer. The assembly was annealed for approximately 5 hours.

Figure 4:
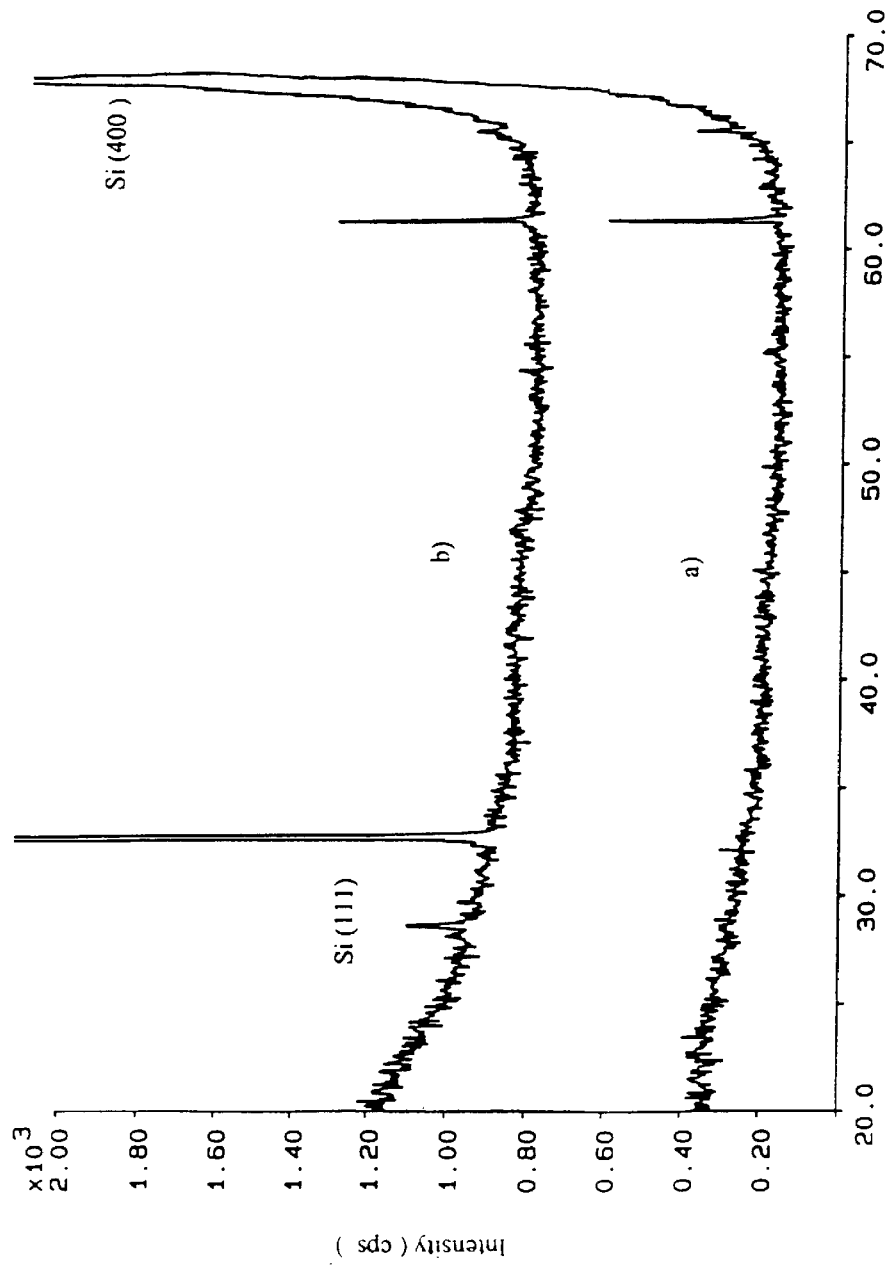
FIG. 4 is an X-ray diffraction spectrum of the thin film of FIG. 2.
Figure 7:
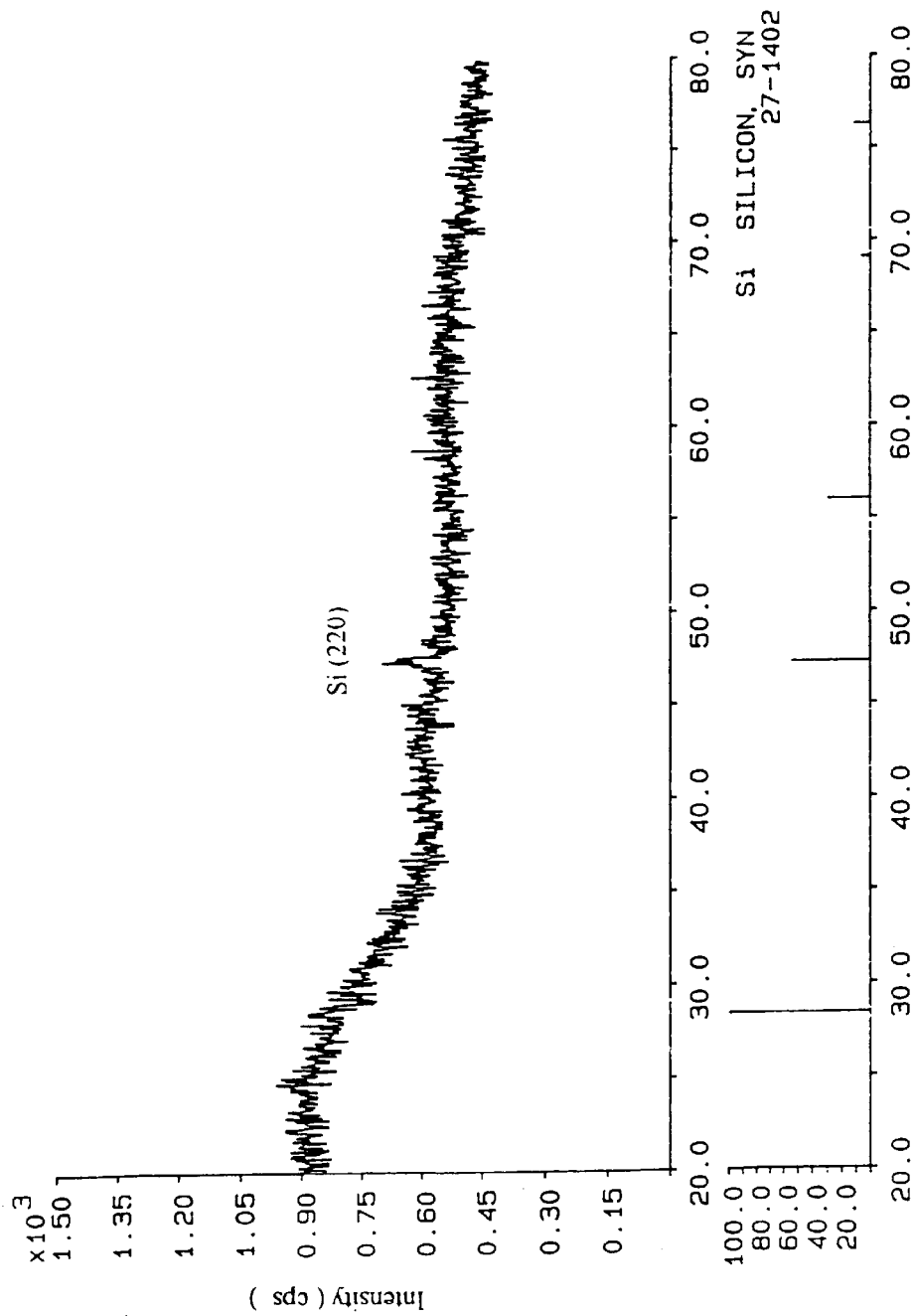
FIG. 7 is an X-ray diffraction spectrum of the thin film of FIG. 5.

Upon cooling and removal of the silicon wafer, the surface of the substrate was composed of a crystalline silicon thin film approximately 1000 Å in thickness. Analysis was made of this crystalline film and compared to a randomly oriented crystalline sample produced by annealing an exposed a-Si substrate. As seen in FIGS. 2 and 3, TEM and electron diffraction examination of the standard annealed sample showed standard crystalline formation with small grain size (less than 0.1 microns). The X-ray diffraction spectrum in FIG. 4 shows the random peaks and some (111) texture expected from this preparation method. The time required for crystallization was high—approximately 24 hours. In contrast, examination of the silicon thin film produced by the method of the invention shows distinct differences from the standard annealed sample. As shown in FIGS. 5 and 6, TEM and electron diffraction analysis shows large grain formation (at least 10 microns) and a diffraction pattern of (110) orientation only. The crystalline film may even comprise a single grain with a large number of defects from stacking faults and dislocations, and exhibiting the single (110) orientation, as shown in the X-ray diffraction spectrum of FIG. 7. As compared to the randomly oriented crystalline sample produced by annealing, the crystallization time for the film produced by the method of the invention was reduced be a factor of five—crystallization having been achieved in approximately 5 hours.

Further experimentation determined that the orientation of the silicon wafer did not matter with regard to the orientation of the crystalline thin film. A film with (110) orientation was produced by the above methodology from silicon wafers with orientations of either (100), (110) or (111).

The crystalline silicon thin film produced from the a-Si thin film by the method of the invention exhibited much improved properties relative to its application in thin film transistor technology. As shown in FIG. 8, the carrier mobility (Hall mobility) of the induced crystalline thin film was in the range of 100 to 250 $cm^2$/V-sec, which is a 10 to 25 fold improvement over p-type polycrystalline silicon thin films and a 25 to 250 fold improvement over amorphous silicon. The crystal growth occurs inwardly from the surface of the amorphous thin film in contact with the nucleation inducing member, as opposed to other crystallization methods where growth occurs from the internal interface. The size of the crystalline grains is a factor of the number of contact points on the nucleation inducing member—the fewer the contact points, the larger the grains, and vice versa.

It is understood that equivalents and substitutions may be obvious to those skilled in the art, and the above examples are by way of illustration. The true scope and definition of the invention therefore is to be as set forth in the following claims.

We claim:

1. A method of forming a crystalline thin film from an amorphous semiconductor thin film comprising the steps of providing an amorphous thin film composed of a semiconductor material whereby the amorphous thin film has an exposed surface, providing a generally planar nucleation inducing member having a number of micro-scale surface contact points and with a hardness equal to or greater than the hardness of the amorphous semiconductor thin film, contacting under pressure the surface contact points of the nucleation inducing member with the exposed surface of the amorphous thin film to form an assembly, annealing the assembly to crystallize the amorphous thin film, and removing the nucleation inducing member.

2. The method of claim 1, where said amorphous thin film is formed by depositing it onto a backing substrate.

3. The method of claim 1, where said surface contact points are less than approximately 20 microns in scale.

4. The method of claim 1, where said annealing is performed within a range between 300 and 700 degrees C.

5. The method of claim 4, where said annealing is performed within a range between 500 and 525 degrees C.

6. The method of claim 1, where said annealing is performed within a range of approximately 1 to 24 hours.

7. The method of claim 1, where said annealing is performed within a range of approximately 4 to 6 hours.

8. The method of claim 1, where said surface contact points are created by roughening the surface of the nucleation inducing member using abrasives.

9. The method of claim 1, where said surface contact points are created by patterning the surface of the nucleation inducing member by micro-machining.

10. The method of claim 1, where the nucleation inducing member is composed of a crystalline semiconductor material.

11. The method of claim 10, where the crystalline nucleation inducing member and the amorphous thin film are composed of the same semiconductor material.

12. The method of claim 11, where the nucleation inducing member is a single crystal wafer.

13. The method of claim 1, where said annealing is performed by unidirectional exposure of the assembly to high temperature lamps.

14. The method of claim 1, where said nucleation inducing member is removed during the annealing step.

* * * * *